United States Patent
Son et al.

(10) Patent No.: US 9,059,381 B2
(45) Date of Patent: Jun. 16, 2015

(54) LIGHT EMITTING DEVICE HAVING WAVELENGTH CONVERTING LAYER AND METHOD OF FABRICATING THE SAME

(75) Inventors: Jung Hun Son, Ansan-si (KR); Seok Soon Kwon, Ansan-si (KR); Jung Doo Kim, Ansan-si (KR); Seoung Ho Jung, Ansan-si (KR); Jung Hwa Jung, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 17 days.

(21) Appl. No.: 13/362,107

(22) Filed: Jan. 31, 2012

(65) Prior Publication Data

US 2012/0193670 A1 Aug. 2, 2012

(30) Foreign Application Priority Data

Jan. 31, 2011 (KR) .................. 10-2011-0009263

(51) Int. Cl.
| | | |
|---|---|---|
| *H01L 33/00* | (2010.01) | |
| *H01L 21/00* | (2006.01) | |
| *H01L 33/50* | (2010.01) | |
| *H01L 33/62* | (2010.01) | |

(52) U.S. Cl.
CPC .............. *H01L 33/504* (2013.01); *H01L 33/62* (2013.01); *H01L 33/508* (2013.01)

(58) Field of Classification Search
CPC ................................ H01L 33/62; B82Y 20/00
USPC ..................... 257/99, E33.066; 438/22
See application file for complete search history.

(56) References Cited

U.S. PATENT DOCUMENTS

| | | | |
|---|---|---|---|
| 6,696,703 B2 * | 2/2004 | Mueller-Mach et al. ........ 257/98 |
| 6,744,077 B2 * | 6/2004 | Trottier et al. ................ 257/103 |
| 7,065,118 B2 * | 6/2006 | Tojo et al. .................. 372/49.01 |
| 7,351,356 B2 * | 4/2008 | Delsing et al. .......... 252/301.4 S |
| 8,247,828 B2 * | 8/2012 | Bechtel et al. .................. 257/98 |
| 2004/0041220 A1 * | 3/2004 | Kwak et al. .................... 257/432 |
| 2004/0164311 A1 * | 8/2004 | Uemura .......................... 257/99 |
| 2005/0139851 A1 * | 6/2005 | Sato ................................ 257/99 |
| 2007/0120129 A1 * | 5/2007 | DenBaars et al. .............. 257/79 |
| 2009/0072710 A1 * | 3/2009 | Schmidt et al. ............... 313/503 |
| 2010/0117106 A1 * | 5/2010 | Trottier ........................... 257/98 |
| 2010/0127283 A1 * | 5/2010 | van de Ven et al. ............. 257/89 |
| 2010/0127284 A1 * | 5/2010 | Nagai ............................. 257/91 |
| 2012/0018754 A1 * | 1/2012 | Lowes ............................ 257/98 |

* cited by examiner

*Primary Examiner* — Fernando L Toledo
*Assistant Examiner* — Neil Prasad
(74) *Attorney, Agent, or Firm* — H.C. Park & Associates, PLC (57) ABSTRACT

A light emitting device having a wavelength converting layer. The light emitting device includes a substrate; a semiconductor stack having a first conductive-type semiconductor layer, an active layer and a second conductive-type semiconductor layer disposed on the substrate; a first wavelength converting layer covering a top of the semiconductor stack; and a second wavelength converting layer disposed on the first wavelength converting layer and having a width narrower than the first wavelength converting layer. The second wavelength converting layer is employed, thereby being capable of reducing a color variation according to a viewing angle.

24 Claims, 5 Drawing Sheets

LIGHT EMITTING DEVICE HAVING WAVELENGTH CONVERTING LAYER AND METHOD OF FABRICATING THE SAME

CROSS-REFERENCE TO RELATED APPLICATION

This application claims priority from and the benefit of Korean Patent Application No. 10-2011-0009263, filed on Jan. 31, 2011, which is hereby incorporated by reference for all purposes as if fully set forth herein.

BACKGROUND

1. Field

Exemplary embodiments of the present invention provide a light emitting device and a method of fabricating the same, and more particularly, to a light emitting device having a wavelength converting layer and a method of fabricating the same.

2. Discussion of the Background

Current light emitting diodes (LEDs) can be made lightweight and compact, and have advantages of energy reduction and long lifetime. Accordingly, LEDs have been used as backlight sources for various types of display devices including cellular phones, and the like. Since a light emitting device having an LED mounted therein, i.e., an LED package, can implement white light having a high color rendering property, it is expected that the LED will be utilized for general illumination by substituting for white light sources such as fluorescent lamps.

Meanwhile, there are various methods of implementing white light using LEDs, and a method is generally used in which white light is implemented by combining an InGaN LED that emits blue light of 430 to 470 nm and a phosphor that can convert the blue light into long wavelength light. For example, the white light can be implemented by combining a blue LED and a yellow phosphor excited by light from the blue LED to emit yellow light or by combining a blue LED and green or red phosphors.

Conventionally, a white light emitting device has been formed by applying a resin containing a phosphor into a recess region of a package having LEDs mounted therein. However, as the resin is applied into the package, the phosphor is not uniformly distributed in the resin, and the resin is not uniformly formed to have constant dimensions between the light emitting devices. As a result, a color variation according to viewing angles easily occurs in a light emitting device, and it is difficult to obtain uniform chromaticity between light emitting devices fabricated in the same process.

Accordingly, studies have been conducted to develop a technique for forming a wavelength converting layer with a uniform thickness by attaching a wavelength converting sheet on an LED or using a conformal coating technique. However, since light emitted from the LED does not have a uniform luminous intensity distribution according to a viewing angle, when the wavelength converting layer with the uniform thickness is formed, a color variation according to a viewing angle may occur.

Figure 1:
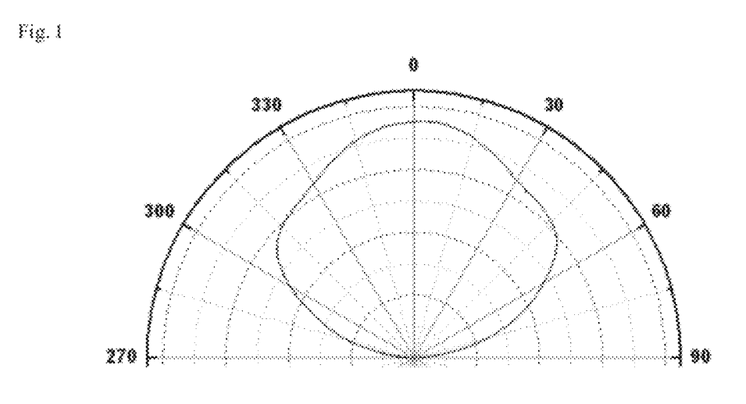
FIG. 1 shows an example of luminous intensity distribution according to a viewing angle of a horizontal blue LED.

FIG. 1 shows an example of luminous intensity distribution according to a viewing angle of a horizontal blue LED.

Referring to FIG. 1, the luminous intensity is highest in a vertical direction from an LED, i.e., at a position at which the viewing angle is zero degrees, and the luminous intensity decreases as the viewing angle increases. The luminous intensity is generally highest at the position at which the viewing angle is zero degrees even when the shape of a substrate or epitaxial layer is controlled or a surface texture is used in order to modify the shape of the LED and improve light extraction efficiency.

Since the luminous intensity distribution of light emitted from the LED varies depending on the viewing angle, when a wavelength converting layer with a uniform thickness is formed on the LED, the luminous intensity distribution of light obtained by mixing blue light and wavelength-converted light together also varies depending on the viewing angle. Moreover, the ratio of the blue light to the mixed light is relatively increased at a viewing angle at which the intensity of the blue light is greater. As a result, a color variation according to the viewing angle occurs.

SUMMARY OF THE INVENTION

Exemplary embodiments of the present invention provide a reduction in color variation according to a viewing angle in a light emitting device having a wavelength converting layer with a uniform thickness using a wavelength converting sheet or a conformal coating technique.

Additional features of the invention will be set forth in the description which follows, and in part will be apparent from the description, or may be learned by practice of the invention.

An exemplary embodiment of the present invention discloses a light emitting device including: a substrate; a semiconductor stack disposed on the substrate, the semiconductor stack having a first conductive-type semiconductor layer, an active layer and a second conductive-type semiconductor layer; a first wavelength converting layer covering a top of the semiconductor stack; and a second wavelength converting layer disposed on the first wavelength converting layer, the second wavelength converting layer having a width narrower than the first wavelength converting layer.

An exemplary embodiment of the present invention also discloses a method of fabricating a light emitting device, which comprises preparing a substrate having a plurality of semiconductor stacks aligned thereon, wherein each of the semiconductor stacks includes a first conductive-type semiconductor layer, an active layer and a second conductive-type semiconductor layer; forming a first wavelength converting layer to cover the plurality of semiconductor stacks; and forming a plurality of second wavelength converting layers on the first wavelength converting layer. Here, the second wavelength converting layer is disposed restrictively within a top region of a corresponding semiconductor stack. The second wavelength converting layer is additionally formed on the first wavelength converting layer, thereby fabricating a light emitting device capable of reducing a color variation.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and willfully convey the scope of the invention to those skilled in the art. In the drawings, the size and relative sizes of layers and regions may be exaggerated forclarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
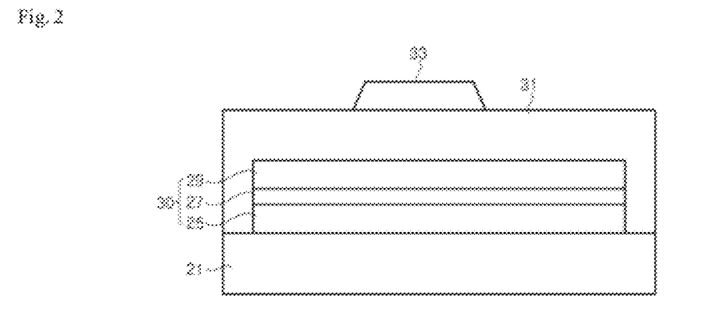
FIG. 2 is a schematic sectional view illustrating a light emitting device according to a first exemplary embodiment of the present invention.

FIG. 2 is a schematic sectional view illustrating a light emitting device according to an exemplary embodiment of the present invention.

Referring to FIG. 2, the light emitting device includes a substrate 21; a semiconductor stack 30 including a first conductive-type semiconductor layer 25, an active layer 27, and a second conductive-type semiconductor layer 29; a first wavelength converting layer 31, and a second wavelength converting layer 33.

The substrate 21 is not particularly limited as long as it is a support substrate capable of supporting the semiconductor stack 30. For example, the substrate 21 may be a growth substrate, such as sapphire substrate, silicon carbide substrate, spinel or silicon substrate, on which nitride semiconductor layers can be grown. Alternatively, the substrate 21 may be another support substrate instead of a growth substrate, such as a ceramic substrate, printed circuit board or metal substrate.

The active layer 27 and the first and second conductive-type semiconductor layers 25 and 29 may be formed of a III-N-based compound semiconductor, e.g., an (Al, Ga, In)N semiconductor. Each of the first and second conductive-type semiconductor layers 25 and 29 may have a single-layered or multi-layered structure. For example, the first conductive-type semiconductor layer 25 and/or the second conductive-type semiconductor layer 29 may include a contact layer and a clad layer, and may further include a superlattice layer. In addition, the active layer 27 may have a single or multiple quantum well structure. For example, the first and second conductive-type semiconductor layers may be n-type and p-type semiconductor layers, respectively.

The first wavelength converting layer 31 covers a top of the semiconductor stack 30. The first wavelength converting layer 31 may cover sides of the semiconductor stack 30. Further, the first wavelength converting layer 31 may also cover sides of the substrate 21. Such a first wavelength converting layer 31 has a flat top surface. The first wavelength converting layer 31 may be formed of a conformal coating sheet, such as resin containing a phosphor, or a wavelength converting sheet, such as glass containing a phosphor.

The second wavelength converting layer 33 is positioned on the first wavelength converting layer 31. The second wavelength converting layer 33 has a width less than the width of the first wavelength converting layer 31. The second wavelength converting layer 33 is disposed on the first wavelength converting layer 31 so as to reduce a color variation according to a viewing angle. The second wavelength converting layer 33 is disposed restrictively within a top region of the semiconductor stack 30.

Generally, since the intensity of light emitted from the semiconductor stack 30 is greatest at a viewing angle of zero degrees, the second wavelength converting layer 33 covers at least a central region of the semiconductor stack 30, so that it is possible to reduce the color variation according to the viewing angle.

The second wavelength converting layer 33 may be formed in a shape having an inclined side, for example, a truncated cone or a truncated quadrangular pyramid as shown in this figure. Alternatively, the second wavelength converting layer 33 may be formed in the shape of a cone or a quadrangular pyramid.

In addition, the second wavelength converting layer 33 may contain the same kind of phosphor at the same combination ratio as the first wavelength converting layer 31. Alternatively, the second wavelength converting layer 33 may contain a different kind of phosphor from the first wavelength converting layer 31 or it may contain the same kind of phosphor with a different combination ratio from the first wavelength converting layer.

Figure 3:
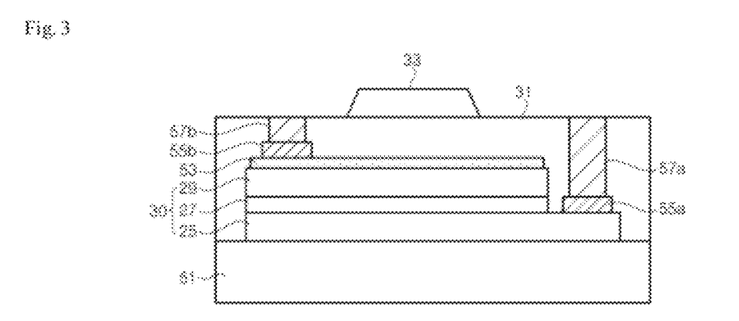
FIG. 3 is a sectional view illustrating a light emitting device according to second exemplary embodiment of the present invention.

FIG. 3 is a sectional view illustrating a light emitting device according to another exemplary embodiment of the present invention. Herein, a horizontal light emitting diode will be described.

Referring to FIG. 3, the light emitting device according to this exemplary embodiment includes a substrate 51, a semiconductor stack 30, a first wavelength converting layer 31 and a second wavelength converting layer 33, and may further include an ohmic contact layer 53, a first electrode pad 55a, a second electrode pad 55b, a first additional electrode 57a and a second additional electrode 57b.

The substrate 51 is a growth substrate, such as sapphire substrate, silicon carbide substrate, spinel or silicon substrate, on which nitride semiconductor layers can be grown. Meanwhile, since the semiconductor stack 30, the first wavelength converting layer 31 and the second wavelength converting layer 33 are similar to those described with reference to FIG. 2, their detailed descriptions will be omitted. However, in this exemplary embodiment, the first wavelength converting layer 31 is disposed over the substrate 51. As shown in this figure, the first wavelength converting layer 31 may cover a top and the sides of the semiconductor stack 30. Alternatively, the first wavelength converting layer 31 may be positioned to cover just the top of the semiconductor stack 30.

In the meantime, a first electrode is electrically connected to the first conductive-type semiconductor layer 25, and a second electrode is electrically connected to the second conductive-type semiconductor layer 29. The first electrode may include the first electrode pad 55a and the first additional electrode 57a, and the second electrode may include second electrode pad 55b and the second additional electrode 57b.

The first electrode pad 55a is in contact with an exposed surface of the first conductive-type semiconductor layer 25, thereby being electrically connected to the first conductive-type semiconductor layer 25. The second electrode pad 55b is disposed above the second conductive-type semiconductor layer 29, thereby being electrically connected to the second conductive-type semiconductor layer 29. The first and second electrode pads 55a and 55b may comprise, for example, Ti, Cu, Ni, Al, Au or Cr, and may be formed of two or more thereof. The ohmic contact layer 53, which may comprise Ni/Au, ITO, IZO or ZnO, may be formed on the second conductive-type semiconductor layer 29 for the purpose of current distribution, and the second electrode pad 55b may be connected to the ohmic contact layer 53.

The first and second additional electrodes 57a and 57b are disposed on the first and second electrode pads 55a and 55b, respectively. The first and second additional electrodes 57a and 57b may be formed as bumps on the electrode pads 55a and 55b, respectively. For example, the first and second additional electrodes 57a and 57b may be formed as bumps using a plating technique or as ball bumps using a ball bonding technique. The first and second additional electrodes 57a and 57b are exposed to the outside through the first wavelength converting layer 31.

The second wavelength converting layer 33 is positioned on the first wavelength converting layer 31. Particularly, the second wavelength converting layer 33 may be disposed restrictively within a top region of the second conductive-type semiconductor layer 29. Also, the second wavelength converting layer 33 may be disposed distant from the first and second additional electrodes 55a and 55b.

The second wavelength converting layer 33 may be formed to have an inclined side, for example, a truncated cone or a truncated quadrangular pyramid, as described with reference to FIG. 2. Alternatively, the second wavelength converting layer 33 may be formed in the shape of a cone or a quadrangular pyramid. In addition, the second wavelength converting layer 33 may contain the same kind of phosphor at the same combination ratio as the first wavelength converting layer 31. Alternatively, the second wavelength converting layer 33 may contain a different kind of phosphor from the first wavelength converting layer 31 or may contain the same kind of phosphor at a different combination ratio from the first wavelength converting layer.

Figure 4:
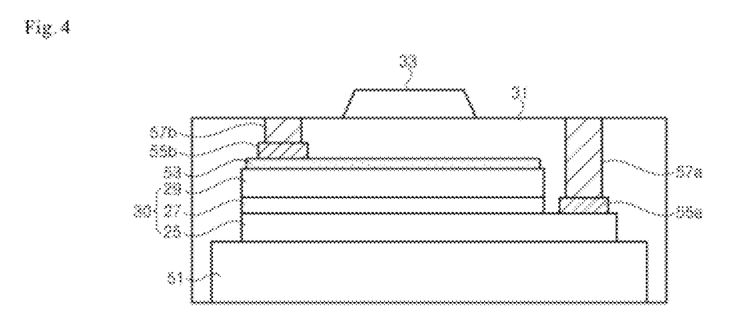
FIG. 4 is a sectional view illustrating a light emitting device according to a third exemplary embodiment of the present invention.

FIG. 4 is a sectional view illustrating a light emitting device according to a another exemplary embodiment of the present invention.

Referring to FIG. 4, the light emitting device according to this exemplary embodiment is similar to the light emitting diode described with reference to FIG. 3. However, there is a difference therebetween in that the first wavelength converting layer 31 covers the sides of the substrate 51.

The substrate 51 may be a transparent substrate, and the first wavelength converting layer 31 may perform wavelength conversion on light emitted through the sides of the substrate 51.

Figure 5:
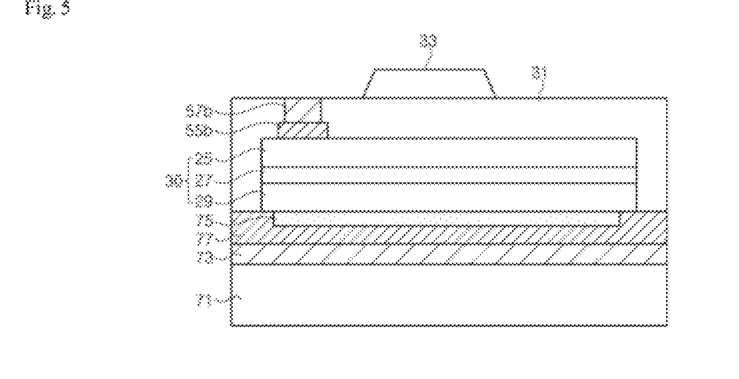
FIG. 5 is a sectional view illustrating a light emitting device according to a fourth exemplary embodiment of the present invention.

FIG. 5 is a sectional view illustrating a light emitting device according to another exemplary embodiment of the present invention. Herein, a vertical LED will be described.

Referring to FIG. 5, the light emitting device includes a substrate 71, a semiconductor stack 30 including a first conductive-type semiconductor layer 25, an active layer 27 and a second conductive-type semiconductor layer 29, an upper electrode pad 55b, an additional electrode 57b, a first wavelength converting layer 31 and a second wavelength converting layer 33. In addition, the light emitting device may further include a reflective metal layer 75, a barrier metal layer 77 and a bonding metal 73.

The substrate 71 is distinguished from a growth substrate for growing the semiconductor layers 25, 27 and 29 thereon. The substrate 71 is a secondary substrate, which is attached to the previously grown compound semiconductor layers 25, 27 and 29. The substrate 71 may be a conductive substrate, for example, a metal substrate or semiconductor substrate. Alternatively, the substrate 71 may be an insulation substrate such as sapphire substrate.

The semiconductor stack 30 is disposed above the substrate 71, and includes the first conductive-type semiconductor layer 25, the active layer 27 and the second conductive-type semiconductor layer 29. Here, like a general vertical LED, the semiconductor stack 30 may have the p-type compound semiconductor layer 29 positioned closer to the substrate 71 than the n-type compound semiconductor layer 25. The semiconductor stack 30 may be disposed above a partial area of the substrate 71. That is, the substrate 71 may have a relatively broad area as compared with the semiconductor stack 30, and the semiconductor stack 30 may be disposed in a region surrounded by an edge of the substrate 71.

Since the first conductive-type semiconductor layer 25, the active layer 27 and the second conductive-type semiconductor layer 29 are similar to those described with reference to FIG. 2, their detailed descriptions will be omitted. Meanwhile, the n-type compound semiconductor layer 25 having a relatively small resistance is disposed opposite the substrate 71, whereby a top surface of the n-type compound semiconductor layer 25 may be roughened.

The reflective metal layer 75 may be interposed between the substrate 71 and the semiconductor stack 30. The barrier metal layer 77 may be interposed between the substrate 71 and the reflective metal layer 75 and to surround the reflective metal layer 75. Further, the substrate 71 may be bonded to the semiconductor stack 30 through the bonding metal 73. The reflective metal layer 75 and the barrier metal layer 77 may serve as a lower electrode, which is electrically connected to the second conductive-type semiconductor layer 29.

In the meantime, the first wavelength converting layer 31 may be disposed above the semiconductor stack 30. Alternatively, the first wavelength converting layer 31 may cover the sides of the semiconductor stack 30, and further, the sides of the substrate 71. In addition, the second wavelength converting layer 33 may be disposed above the first wavelength converting layer 31, and may be disposed restrictively within a top region of the semiconductor stack 30. The second wavelength converting layer 33 may be formed to have an inclined side, for example, a truncated cone or a truncated quadrangular pyramid as described with reference to FIG. 2. Alternatively, the second wavelength converting layer 33 may be formed in the shape of a cone or a quadrangular pyramid. Further, the second wavelength converting layer 33 may contain the same kind of phosphor at the same combination ratio as the first wavelength converting layer 31. Alternatively, the second wavelength converting layer 33 may contain a different kind of phosphor from the first wavelength converting layer 31, or may contain the same kind of phosphor at a different combination ratio from the first wavelength converting layer 31.

Meanwhile, the upper electrode pad 55b is positioned on top of the first conductive-type semiconductor layer 25, thereby being electrically connected to the first conductive-type semiconductor layer 25. The additional electrode 57b is positioned on the upper electrode pad 55b. The additional electrode 57b may have the same shape and structure as the second additional electrode 57b described with reference to FIG. 3. The additional electrode 57b is exposed to the outside through the first wavelength converting layer 31.

FIGS. 6a, 6b, 6c and 6d are schematic sectional views illustrating a method of fabricating a light emitting device according to an exemplary embodiment of the present invention.

Figure 6A:
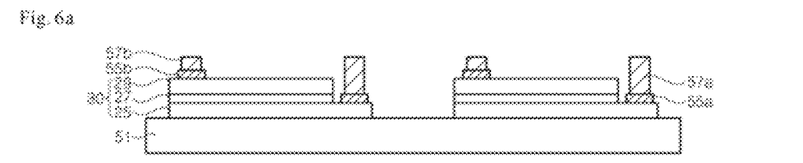
FIG. 6a, FIG. 6b, FIG. 6c, and FIG. 6d are sectional views illustrating a method of fabricating a light emitting device according to a fifth exemplary embodiment of the present invention.

Referring to FIG. 6a, a plurality of semiconductor stacks 30 are first aligned on a substrate 51. The plurality of semiconductor stacks 30 may be formed by growing epitaxial layers including a first conductive-type semiconductor layer 25, an active layer 27, and a second conductive-type semiconductor layer 29 on the substrate 51 and patterning the epitaxial layers. An ohmic contact layer (not shown) such as a transparent conductive layer may also be formed on each semiconductor stack 30.

Thereafter, first and second electrode pads 55a and 55b may be formed to be electrically connected to each semiconductor stack 30, and first and second additional electrodes 57a and 57b may be formed on the electrode pads 55a and 55b, respectively. The first and second additional electrodes 57a and 57b may be formed, for example, using chemical vapor deposition, sputtering, plating, solder balls, or the like.

Figure 6B:
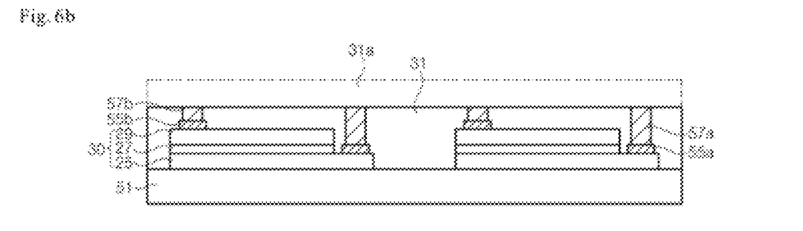

Referring to FIG. 6b, a first wavelength converting layer 31 is formed to cover the semiconductor stacks 30. The first wavelength converting layer 31 may be formed by forming a preliminary wavelength converting layer 31a of a wavelength converting layer material to be thick enough to cover the first and second additional electrodes 57a and 57b, such as silicon resin containing a phosphor, and then removing a portion of the preliminary wavelength converting layer 31a using a grinding or fly cutting technique. The preliminary wavelength converting layer 31a may be formed using various coating methods including injection molding, transfer molding, compression molding, printing and the like. While a portion of the preliminary wavelength converting layer 31a is removed using the grinding or fly cutting technique, portions of the additional electrodes 57a and 57b may be removed together, whereby the top surfaces of the additional electrodes 57a and 57b can be planarized. Particularly, the top surface of the first wavelength converting layer and the top surfaces of the additional electrodes 57a and 57b can be formed to be smooth using the fly cutting technique.

Alternatively, the first wavelength converting layer 31 may be formed by attaching a wavelength converting sheet, such as glass containing a phosphor, onto the semiconductor stacks 30.

Figure 6C:
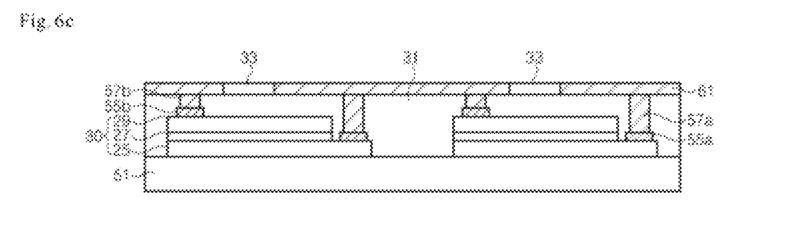

Referring to FIG. 6c, a mask 61 having an opening pattern is disposed on the first wavelength converting layer 31. For example, the mask 61 is disposed on the first wavelength converting layer 31 so that the openings in the mask 61 correspond to the semiconductor stacks, respectively.

Thereafter, the opening pattern is filled with a material for the second wavelength converting layer 33. The second wavelength converting layer 33 may be formed by a screen printing technique using a squeeze. The second wavelength converting layer 33 may be formed of resin, e.g., silicon resin, containing a phosphor. The second wavelength converting layer 33 may be formed of the same material as the first wavelength converting layer 31. The kind and density of the phosphor in the second wavelength converting layer 33 may be identical to those of the first wavelength converting layer 31. Alternatively, the kind and density of the phosphor in the second wavelength converting layer may be controlled to be different from those of the first wavelength converting layer.

Figure 6D:
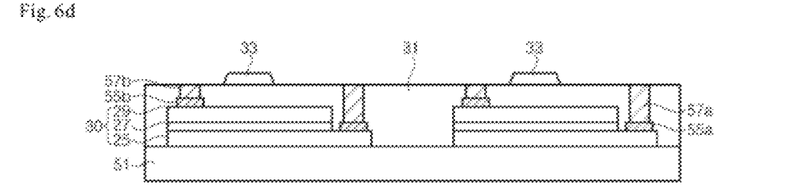

Referring to FIG. 6d, the mask 61 is removed, and the plurality of wavelength converting layers 33 remain on the first wavelength converting layer 31. The second wavelength converting layer 33 may be cured before or after the mask 61 is removed. Accordingly, the second wavelength converting layer 33 can be formed to have an inclined side, as shown in FIG. 6d. The shape of the second wavelength converting layer 33 may be controlled by the viscosity and thixotropy of silicon resin. For example, when a silicon resin having high viscosity and thixotropy is used, a relatively small side deformation occurs, and therefore, the side is steeply inclined. On the other hand, when a silicon resin having low viscosity and thixotropy is used, a large side deformation occurs, and therefore, the side is relatively gently inclined.

Subsequently, the first wavelength converting layer 31 and substrate 51 are divided into sections, thereby completing individual light emitting devices, each shown in FIG. 3. The first wavelength converting layer 31 may be previously divided before the second wavelength converting layer 33 is formed or divided thereafter.

According to this exemplary embodiment, a light emitting device is provided, in which the first wavelength converting layer 31 is positioned on the substrate 51. Further, a light emitting device is provided, in which the second wavelength converting layer 33 is partially disposed on the semiconductor stack 30. Thus, it is possible to reduce a color variation according to a viewing angle using the second wavelength converting layer 33.

In addition, according to this exemplary embodiment, since the first and second wavelength converting layers 31 and 33 are formed on the growth substrate 51, i.e., on a wafer level, it is possible to simplify the process of fabricating the light emitting device.

Meanwhile, although it has been described in this exemplary embodiment that the plurality of semiconductor stacks 30 are aligned on the growth substrate 51 and the first and second wavelength converting layers 31 and 33 are then formed thereon, the first and second wavelength converting layers 31 and 33 may be formed through the same process even when the plurality of semiconductor stacks 30 are aligned on the support substrate 71 (see FIG. 5). Accordingly, the light emitting device of FIG. 5 may be provided.

FIGS. 7a, 7b, 7c and 7d are sectional views illustrating a method of fabricating a light emitting device according to another exemplary embodiment of the present invention. In this exemplary embodiment, a process of forming a wavelength converting layer on a chip level will be described.

Figure 7A:
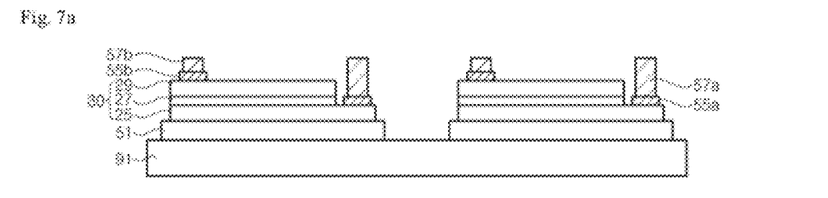
FIG. 7a, FIG. 7b, FIG. 7c, and FIG. 7d are sectional views illustrating a method of fabricating a light emitting device according to a sixth exemplary embodiment of the present invention.

Referring to FIG. 7a, divided chips are arranged on a support substrate 91. The chip includes a substrate 51; a semiconductor stack 30 including a first conductive-type semiconductor layer 25, an active layer 27, and a second conductive-type semiconductor layer 29; a first electrode pad 55a; and a second electrode pad 55b. The substrate 51, the semiconductor stack 30, the first electrode pad 55a and the second electrode pad 55b are similar to those described with reference to FIG. 3, and therefore, their detailed descriptions will be omitted.

The support substrate 91 supports the semiconductor stacks 30 to be spaced apart at the same intervals. The support substrate 91 may be a substrate made of glass, ceramic, sapphire, GaN, Si or the like.

As described with reference to FIG. 6a, first and second additional electrodes 57a and 57b are formed on the first and second electrode pads 55a and 55b, respectively. The first and second additional electrodes 57a and 57b may be formed after the chips are aligned on the support substrate 91. Alternatively, the first and second additional electrodes 57a and 57b may be formed on a wafer level before the substrate 51 is divided.

Figure 7B:
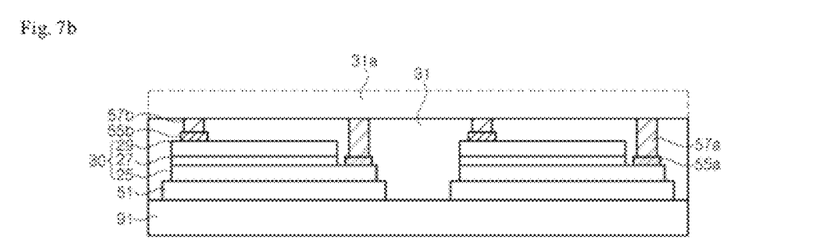

Referring to FIG. 7b, a first wavelength converting layer 31 for covering the semiconductor stacks 30 is formed over the support substrate 91. As described with reference to FIG. 6b, the first wavelength converting layer 31 may be formed by forming a preliminary wavelength converting layer 31a of a wavelength converting layer material to be thick enough to cover the first and second additional electrodes 57a and 57b, and then removing a portion of the preliminary wavelength converting layer 31a.

Figure 7C:
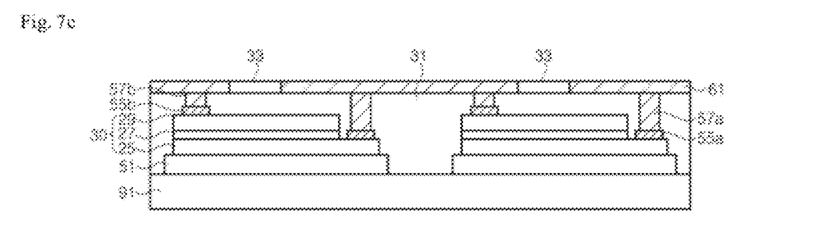
Figure 7D:
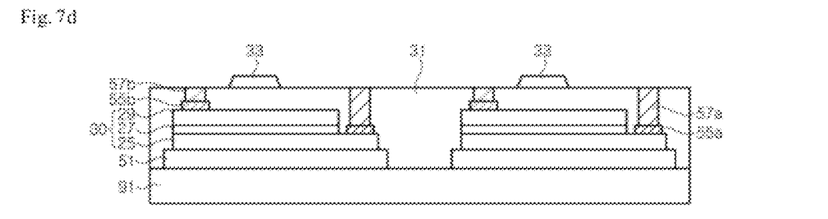

Referring to FIG. 7c, a mask having an opening pattern is disposed on the first wavelength converting layer 31, and a second wavelength converting layer 33, with which the openings are filled, is formed, as described with reference to FIG. 6c. Subsequently, the second wavelength converting layer 33 is cured, and the mask 61 is removed. Thus, as shown in FIG. 7b, the second wavelength converting layers are disposed on the semiconductor stacks 30, respectively.

Thereafter, the first wavelength converting layer 31 is divided, and the support substrate 91 is removed, thereby fabricating a light emitting device as shown in FIG. 4. The support substrate 91 may be removed before or after the first wavelength converting layer 31 is divided.

Meanwhile, although it has been described in this exemplary embodiment that the second wavelength converting layer 33 is formed before the first wavelength converting layer 31 is divided, the second wavelength converting layer 33 may be formed after the first wavelength converting layer 31 is divided.

According to this exemplary embodiment, the first wavelength 31 may cover the sides of the substrate 51, and thus, wavelength conversion can be performed even on light emitted through the side of the substrate 51.

This exemplary embodiment illustrates and describes that the wavelength converting layer is formed in a horizontal LED chip. Alternatively, this exemplary embodiment may be identically applied to a vertical LED chip.

Figure 8:
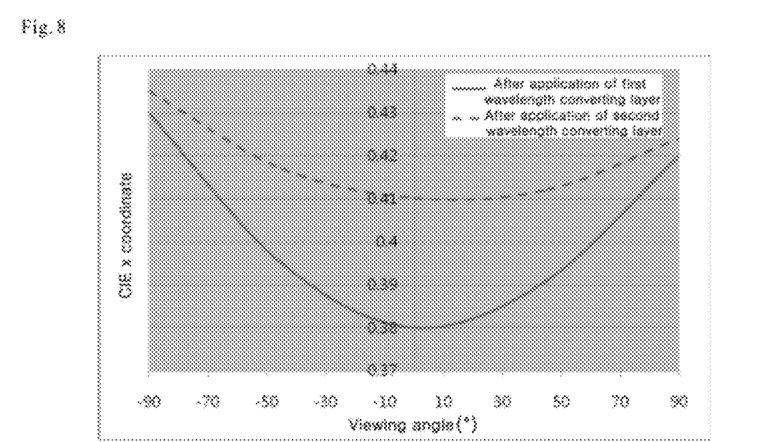
FIG. 8 is a graph illustrating reduction of a color variation according to a viewing angle through the application of a second wavelength converting layer.

FIG. 8 is a graph illustrating reduction of a color variation according to a viewing angle through the application of a second wavelength converting layer.

Using the horizontal LED for emitting blue light as shown in FIG. 3, an LED sample having the first wavelength converting layer 31 applied thereto and an LED sample having the second wavelength converting layer 33 on the first wavelength converting layer 31 applied thereto were fabricated as described with reference to FIGS. 7a to 7d, and then, changes in color variation according to a viewing angle were identified. The LED sample had a size of about 900 μm×900 μm; the first wavelength converting layer 31 had a thickness of about 50 μm; and the second wavelength converting layer 33 had a thickness of about 20 μm. In this embodiment, the second wavelength converting layer 33 had a size of about 450 μm×450 μm and was positioned in a central region of the semiconductor stack 30.

Referring to FIG. 8, in the sample having only the first wavelength converting layer 31 applied thereto, a CIE x coordinate is about 0.38 near a viewing angle of zero degrees, and an increasing rate of the x coordinate according to an increase in viewing angle is relatively large. On the other hand, in the sample having the second wavelength converting layer 33 additionally applied thereto, a CIE x coordinate increases to 0.41 near a viewing angle of zero degrees, and an increasing rate of the x coordinate according to an increase in viewing angle is relatively small.

Thus, it can be seen that when the second wavelength converting layer 33 is formed on a partial region of the first wavelength converting layer 31, it is possible to reduce the color variation according to a viewing angle.

In this experimental example, the width of the second wavelength converting layer 33 was formed corresponding to about ½ of the width of the semiconductor stack 30. Because the second wavelength converting layer 33 is formed to have a smaller width, e.g., the second wavelength converting layer 33 has a width no more than ⅓ of the width of the semiconductor stack, it is expected that the color variation according to a viewing angle can be further reduced.

Meanwhile, in the experimental example, the second wavelength converting layer 33 uses the same composition as the first wavelength converting layer 31. Thus, the kind and combination ratio of a phosphor of the second wavelength converting layer 33 are controlled, so that the x coordinate according to an increase in viewing angle can be more precisely controlled. For example, the second wavelength converting layer 33 contains a larger amount of a red phosphor than the first wavelength converting layer 31, so that the x coordinate can be more increased in central region of the semiconductor stack 30.

Figure 9:
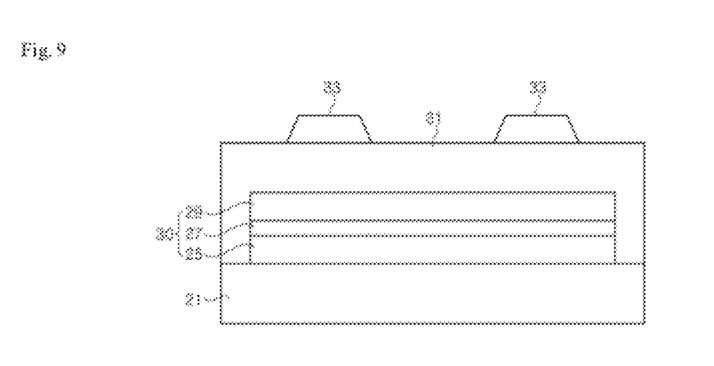
FIG. 9 is a sectional view illustrating a light emitting device according to a seventh exemplary embodiment of the present invention.

The aforementioned exemplary embodiments have illustrated that the second wavelength converting layer 33 is positioned in the central region of the semiconductor stack 30. However, the position of the second wavelength converting layer 33 may be controlled depending on the luminous intensity distribution of the semiconductor stack 30. For example, as shown in FIG. 9, the second wavelength converting layer 33 may be disposed near an edge of the top surface of the first wavelength converting layer 31.

According to the present invention, a second wavelength converting layer is additionally formed on a first wavelength converting layer, so that it is possible to reduce a color variation caused by a luminous intensity distribution according to a viewing angle of an LED. Thus, it is possible to reduce a color variation that may occur according to a viewing angle in the light emitting device to which a wavelength converting layer with a uniform thickness is applied using a wavelength converting sheet or a conformal coating technique.

It will be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.1

What is claimed is:
1. A light emitting device, comprising:
   a substrate;
   a semiconductor stack disposed on the substrate, the semiconductor stack comprising a first semiconductor layer, an active layer and a second semiconductor layer;

a first wavelength converting layer covering a top of the semiconductor stack; and a second wavelength converting layer disposed on a portion of a top surface of the first wavelength converting layer, wherein:

a width of the second wavelength converting layer is less than a width of the first wavelength converting layer and a width of the active layer; and the sides of the second wavelength converting layer are inclined in relation to the top surface of the first wavelength converting layer.

2. The light emitting device of claim 1, wherein the first wavelength converting layer comprises a flat top surface.

3. The light emitting device of claim 2, wherein the second wavelength converting layer comprises a flat top surface.

4. The light emitting device of claim 1, wherein the second wavelength converting layer is disposed on the first wavelength converting layer and configured to reduce a color variation of light emitted through the first wavelength converting layer.

5. The light emitting device of claim 1, wherein the second wavelength converting layer covers at least a central region of the semiconductor stack.

6. The light emitting device of claim 1, wherein the second wavelength converting layer covers a region other than a central region of the semiconductor stack.

7. The light emitting device of claim 1, further comprising at least one electrode electrically connected to the semiconductor stack, wherein the at least one electrode is not covered by the first wavelength converting layer.

8. The light emitting device of claim 7, wherein the second wavelength converting layer is spaced apart from the electrode.

9. The light emitting device of claim 7, wherein the at least one electrode comprises an electrode pad and an additional electrode.

10. The light emitting device of claim 1, wherein the first wavelength converting layer further covers a side of the semiconductor stack, and the second wavelength converting layer is disposed restrictively within a top region of the semiconductor stack.

11. The light emitting device of claim 10, wherein the first wavelength converting layer further covers a side of the substrate.

12. A method of fabricating a light emitting device, comprising:

forming a plurality of semiconductor stacks on a substrate, the semiconductor stacks comprising a first semiconductor layer, an active layer, and a second semiconductor layer;

forming a first wavelength converting layer to cover the semiconductor stacks; and forming a plurality of second wavelength converting layer sections on the first wavelength converting layer, wherein:

each second wavelength converting layer section is disposed within a top region of a corresponding semiconductor stack;

a width of each second wavelength converting layer section is less than a width of the active layer; and the sides of each of the second wavelength converting layer sections are inclined in relation to the top surface of the first wavelength converting layer.

13. The method of claim 12, further comprising forming an electrode on each of the semiconductor stacks before forming the first wavelength converting layer.

14. The method of claim 13, wherein the electrode comprises an electrode pad and an additional electrode.

15. The method of claim 13, wherein forming the first wavelength converting layer comprises:

forming a preliminary wavelength converting layer having a thickness sufficient to cover the electrode; and exposing the electrode by removing a portion of the preliminary wavelength converting layer.

16. The method of claim 12, further comprising dividing the first wavelength converting layer into a plurality of divided first wavelength converting layer sections, wherein the second wavelength converting layer sections are positioned on the respective divided first wavelength converting layer sections, and the second wavelength converting layer section has a width narrower than the divided first wavelength converting layer section.

17. The method of claim 12, wherein forming the second wavelength converting layer comprises:

disposing a mask having an opening pattern on the first wavelength converting layer; and disposing the opening pattern with a material for the second wavelength converting layer in the opening pattern.

18. The method of claim 17, wherein forming the second wavelength converting layer further comprises curing the material for the second wavelength converting layer.

19. The method of claim 12, wherein each second wavelength converting layer section covers a central region of the corresponding semiconductor stack.

20. The method of claim 12, wherein each second wavelength converting layer section covers a region other than a central region of the corresponding semiconductor stack.

21. The light emitting device of claim 1, wherein the second wavelength converting layer comprises a different kind of phosphor than that of the first wavelength converting layer.

22. The light emitting device of claim 1, wherein:

the second wavelength layer comprises the same kind of phosphor as that of the first wavelength converting layer; and the phosphors of the first and second wavelength converting layers have different combination ratios.

23. The method of claim 12, wherein the second wavelength converting layer comprises a different kind of phosphor than that of the first wavelength converting layer.

24. The method of claim 12, wherein:

the second wavelength layer comprises the same kind of phosphor as that of the first wavelength converting layer; and the phosphors of the first and second wavelength converting layers have different combination ratios.

* * * * *